(12) United States Patent
Yen et al.

(10) Patent No.: US 10,483,153 B2
(45) Date of Patent: Nov. 19, 2019

(54) DEEP TRENCH ISOLATION STRUCTURE IN SEMICONDUCTOR DEVICE

(71) Applicant: TAIWAN SEMICONDUCTOR MANUFACTURING CO., LTD., Hsinchu (TW)

(72) Inventors: Yu-Hua Yen, New Taipei (TW); Ching-Hung Kao, Tainan (TW); Po-Jen Wang, Taichung (TW); Tsung-Han Tsai, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/885,524

(22) Filed: Jan. 31, 2018

(65) Prior Publication Data
US 2019/0148219 A1    May 16, 2019

Related U.S. Application Data

(60) Provisional application No. 62/585,958, filed on Nov. 14, 2017.

(51) Int. Cl.
| | | |
|---|---|---|
| *H01L 21/762* | (2006.01) | |
| *H01L 29/06* | (2006.01) | |
| *H01L 27/12* | (2006.01) | |
| *H01L 21/306* | (2006.01) | |
| *H01L 21/311* | (2006.01) | |
| *H01L 21/764* | (2006.01) | |
| *H01L 21/8238* | (2006.01) | |
| *H01L 21/84* | (2006.01) | |
| *H01L 21/027* | (2006.01) | |
| *H01L 21/308* | (2006.01) | |
| *H01L 21/3105* | (2006.01) | |

(52) U.S. Cl.
CPC .. *H01L 21/76283* (2013.01); *H01L 21/30604* (2013.01); *H01L 21/31111* (2013.01); *H01L 21/764* (2013.01); *H01L 21/823878* (2013.01); *H01L 21/84* (2013.01); *H01L 27/1203* (2013.01); *H01L 29/0649* (2013.01); *H01L 21/0274* (2013.01); *H01L 21/3081* (2013.01); *H01L 21/31053* (2013.01); *H01L 21/31144* (2013.01)

(58) Field of Classification Search
None
See application file for complete search history.

(56) References Cited

U.S. PATENT DOCUMENTS

2015/0294984 A1* 10/2015 Cheng ................. H01L 27/1203
                                                          257/347
2018/0166536 A1*  6/2018 Shank .................. H01L 21/762

* cited by examiner

*Primary Examiner* — Long Pham
(74) *Attorney, Agent, or Firm* — Maschoff Brennan

(57) ABSTRACT

An integrated circuit includes a semiconductor substrate, an isolation region, a first active component and at least one deep trench isolation structure. The isolation region is in the semiconductor substrate. The first active component is on the semiconductor substrate. The deep trench isolation structure extends from a bottom of the isolation region toward a bottom of the semiconductor substrate. The deep trench isolation structure has at least one air void therein.

20 Claims, 16 Drawing Sheets

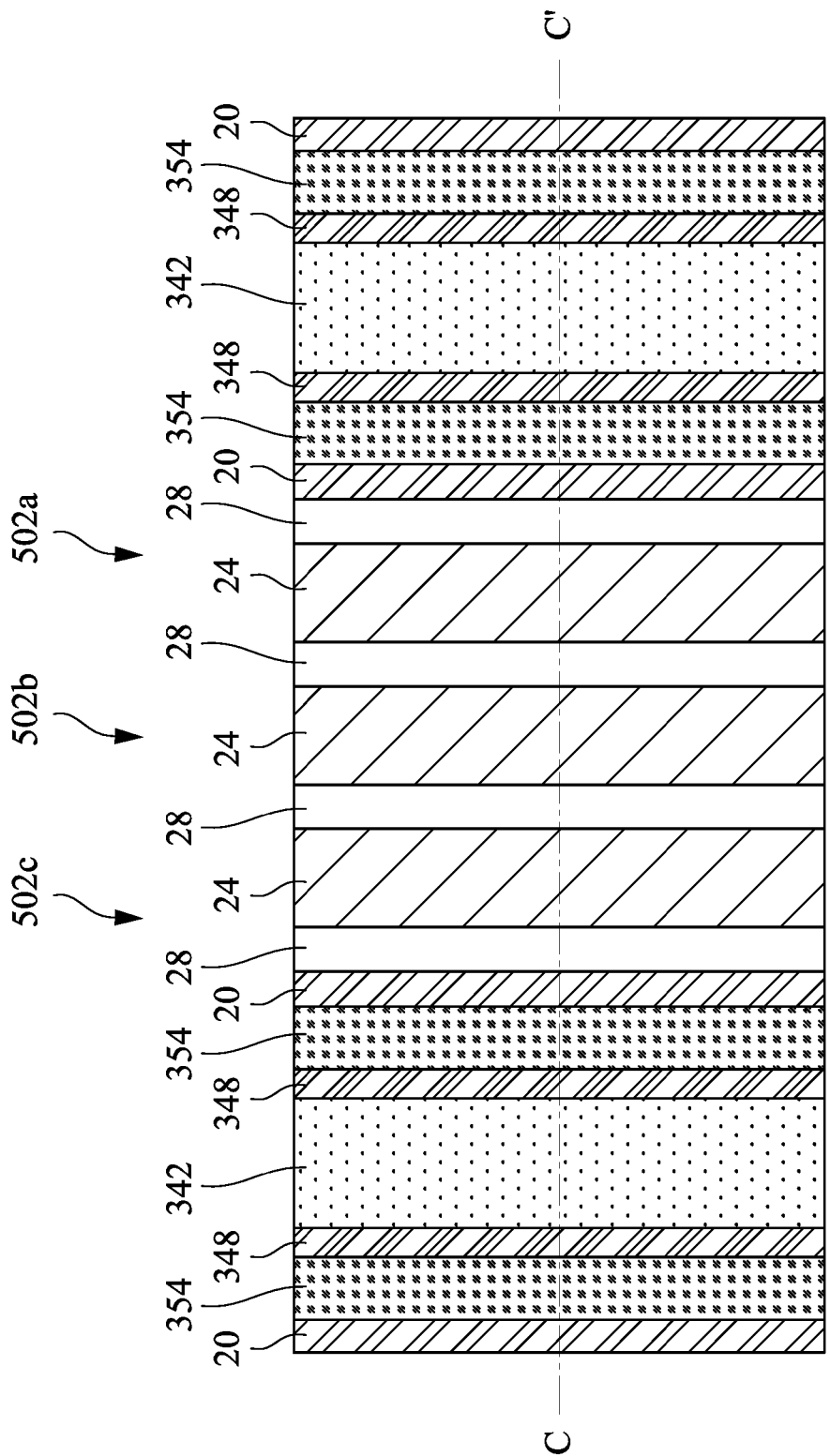

DEEP TRENCH ISOLATION STRUCTURE IN SEMICONDUCTOR DEVICE

PRIORITY CLAIM AND CROSS-REFERENCE

This application claims priority to U.S. Provisional Application Ser. No. 62/585,958, filed Nov. 14, 2017, which is herein incorporated by reference.

BACKGROUND

Modern integrated circuits are formed on the surfaces of semiconductor substrates, which are mostly silicon substrates. Semiconductor devices are isolated from each other by isolation structures formed close to the surface of the respective semiconductor substrates. The isolation structures include field oxides and shallow trench isolation (STI) regions.

Radio frequency current entering from a noise input, for example, antenna is coupled through substrate and the isolation structures. The coupling current in the substrate and isolation structures may cause unwanted resistance and capacitance to an output device, for example, low noise amplifier (LNA) and power amplifier (PA). The coupling current may be attenuated by enlarging the distance (increasing the region of isolation structures) between the noise input and output. However, with the down-scaling of integrated circuits, it is unlikely to yield extra spaces for more isolation structures. The manufacturing cost will increase, and a larger isolation structures may undermine the ability to a higher device speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
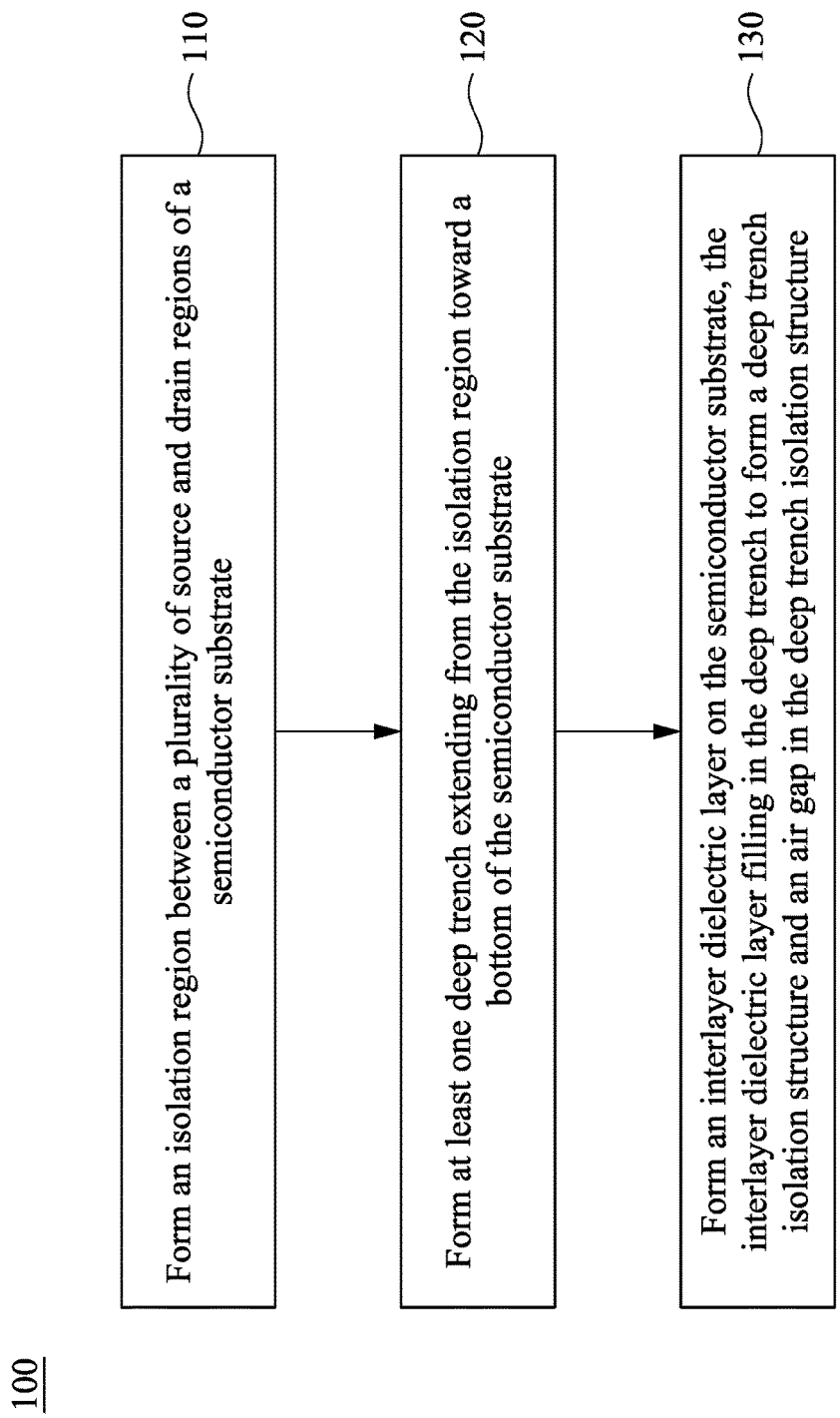
FIG. 1 is a flow chart illustrating a method of fabricating deep trench isolation structures in a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A radio frequency current from an input end will be coupled through the semiconductor substrate and the dielectric layer by equivalent resistance and capacitance and thus will cause unwanted output at an output end. This noise (radio frequency current) may be reduced by different approaches. Expanding the isolation region to a wider area may be an option, while device dimension or active regions is compromised in this means. By addition of deep trench isolation structures in the existing isolation region can significantly reduce crosstalk measured from the semiconductor substrate. The deep trench isolation structures contain not only regular dielectric materials but also air voids which has a dielectric constant close to 1.

Reference is made to FIG. 1, a flow chart of a method 100 of fabricating a semiconductor device in accordance with some embodiments of the instant disclosure. In operation 110, an isolation region is formed between a plurality of active regions of a semiconductor substrate. The method continues with operation 120 in which at least one deep trench is formed. The deep trench extends from the isolation region toward a bottom of the semiconductor substrate. The method continues with operation 130 in which an interlayer dielectric layer is formed on the semiconductor substrate. The interlayer dielectric layer fills in the deep trench to form a deep trench isolation structure. The discussion that follows illustrates embodiments of semiconductor devices that can be fabricated according to the method 100 of FIG. 1. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
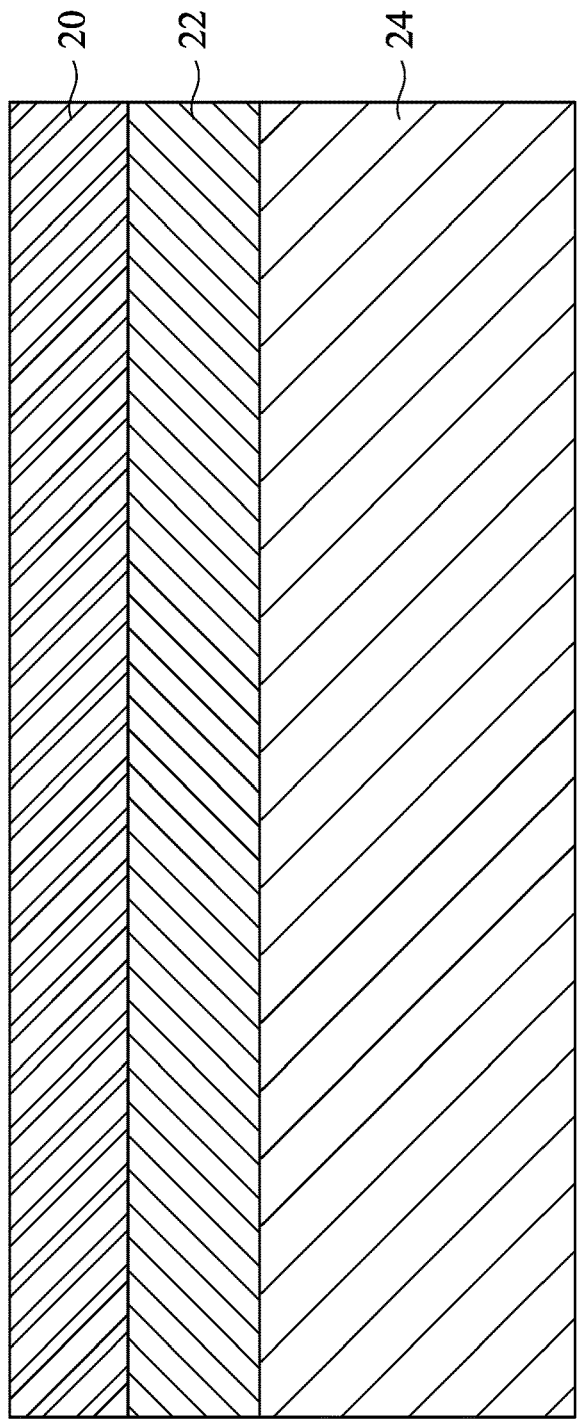
FIGS. 2 through 13 are cross-sectional views and top views of a portion of a semiconductor device at various stages in a deep trench isolation structure process in accordance with some embodiments.

FIG. 2 is a cross-sectional view of semiconductor substrate 18. The semiconductor substrate 18 has a semiconductor-on-insulator (SOI) structure. A semiconductor layer 20 is disposed on a buried insulator layer 22. The buried insulator layer 22 may be a buried oxide (BOX) layer if the buried insulator layer is composed of a dielectric oxide. The buried insulator layer 22 is disposed on a handle substrate 24. The vertical stack of the semiconductor substrate 18 includes, from bottom to top, the handle substrate 24, buried insulator layer 22 and semiconductor layer 20 on an upper surface of the buried insulator layer 22. In some embodiments, the semiconductor substrate 18 further includes a buffer layer. In alternative embodiments, the semiconductor substrate 18 is formed of a bulk semiconductor material, such as silicon.

The handle substrate 24 includes a first semiconductor material, which can be selected from, but is not limited to, silicon, germanium, silicon-germanium, silicon carbon, silicon-germanium-carbon, gallium arsenide, indium arsenide, indium phosphide, III-V compound semiconductor materials, II-VI compound semiconductor materials, organic semiconductor materials, other compound semiconductor materials, and the like. Further, the material of the handle substrate 24 can be a single crystalline, i.e., epitaxial, semiconductor material.

The buried insulator layer 22 is a layer of a dielectric material such as, but is not limited to, silicon oxide. A lower surface of the buried insulator layer 22 contacts an upper surface of the handle substrate 24. The semiconductor layer 20 includes a second semiconductor material, which can be selected from, but is not limited to, silicon, germanium, silicon-germanium, silicon carbon, silicon-germanium-carbon, gallium arsenide, indium arsenide, indium phosphide, III-V compound semiconductor materials, II-VI compound semiconductor materials, organic semiconductor materials, other compound semiconductor materials, and the like. Further, the material of the semiconductor layer 20 can be a single crystalline, i.e., epitaxial, semiconductor material. All or portions of the semiconductor layer 20 can be locally or globally doped with dopants of p-type and/or n-type as needed to form active regions. A lower surface of the semiconductor layer 20 contacts an upper surface of the buried insulator layer 22.

Figure 3:
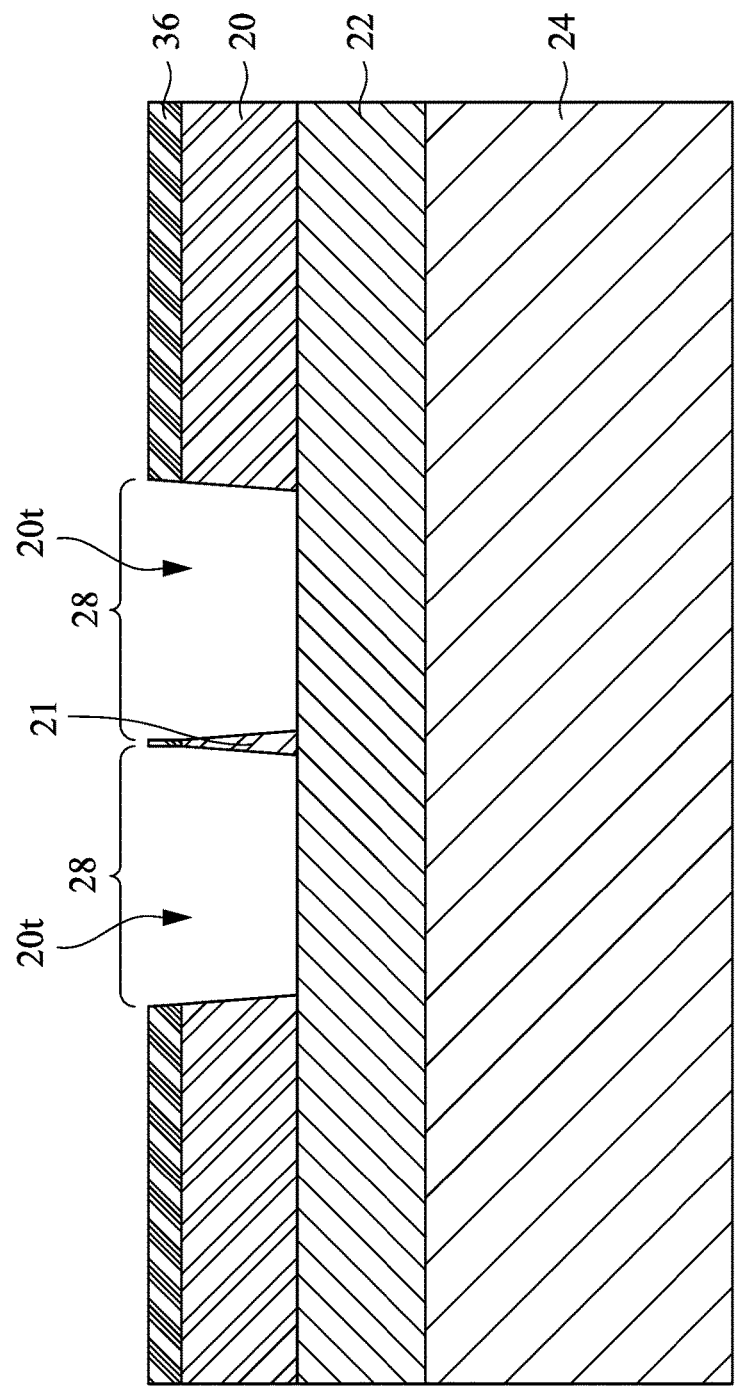

Reference is made to FIG. 3. A hard mask layer 36 is formed on the semiconductor layer 20 and patterned, followed by the formation of trenches 20t of shallow trench regions 28. The hard mask layer 36 can be formed by depositing a blanket dielectric material layer, applying a photoresist thereupon, lithographically patterning the photoresist by lithographic exposure and development, and removing portions of the blanket dielectric material layer underneath openings in the photoresist employing an etching process. The etching process can be a dry etch such as anisotropic ion etch, or a wet etch. The remaining portions of the blanket dielectric material layer constitute the hard mask layer 36. At least one active region covered by the hard mask layer 36 is defined upon formation of the hard mask layer 36. The pattern in the hard mask layer 36 is transferred to the semiconductor layer 20. The trenches 20t are substantially parallel lengthwise and substantially parallel to each other in the semiconductor layer 20. The trenches 20t may have a depth equal to the depth of the semiconductor layer 20, so that the subsequently formed STI regions 28 physically contact buried insulator layer 22.

Figure 4A:
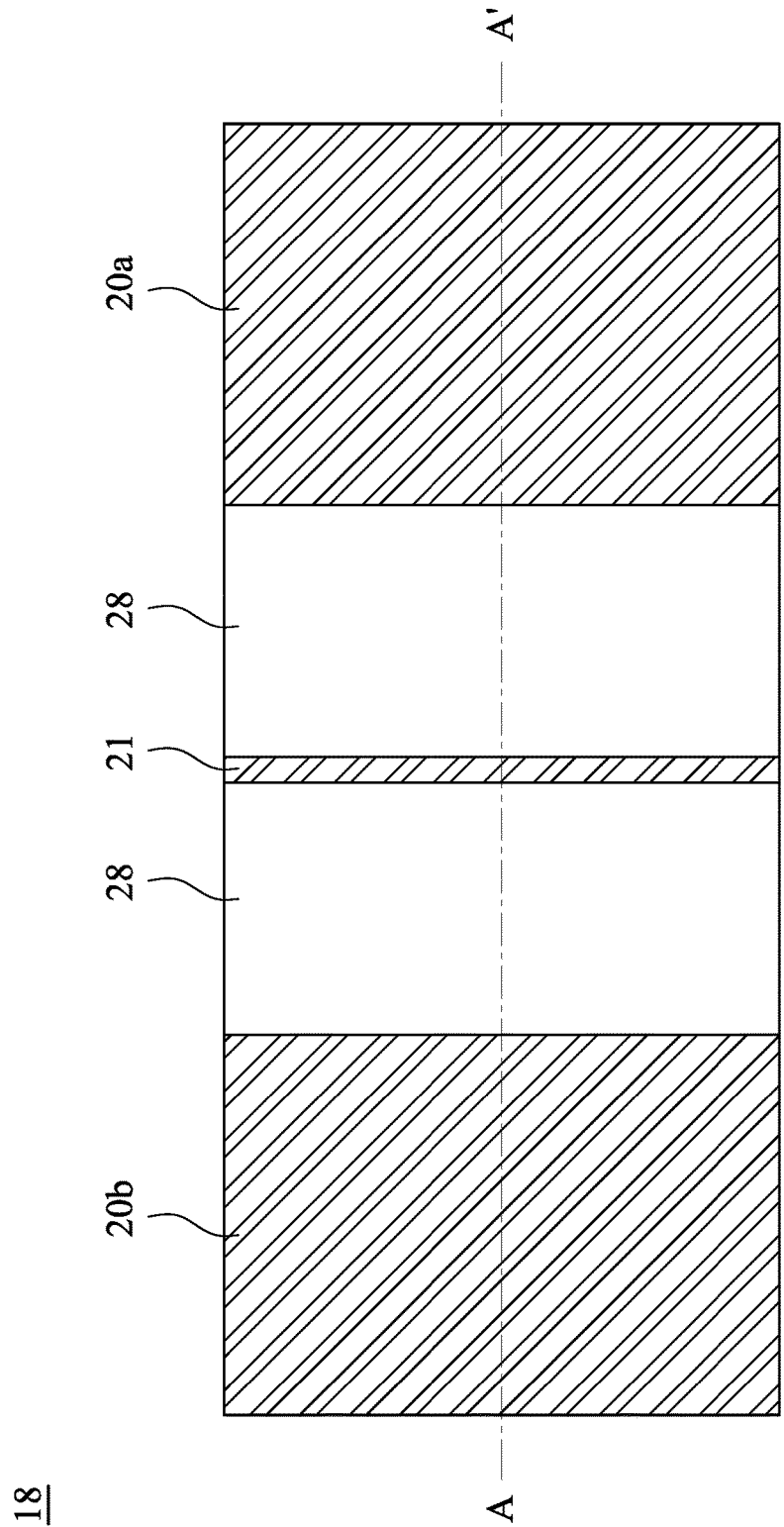
Figure 4B:
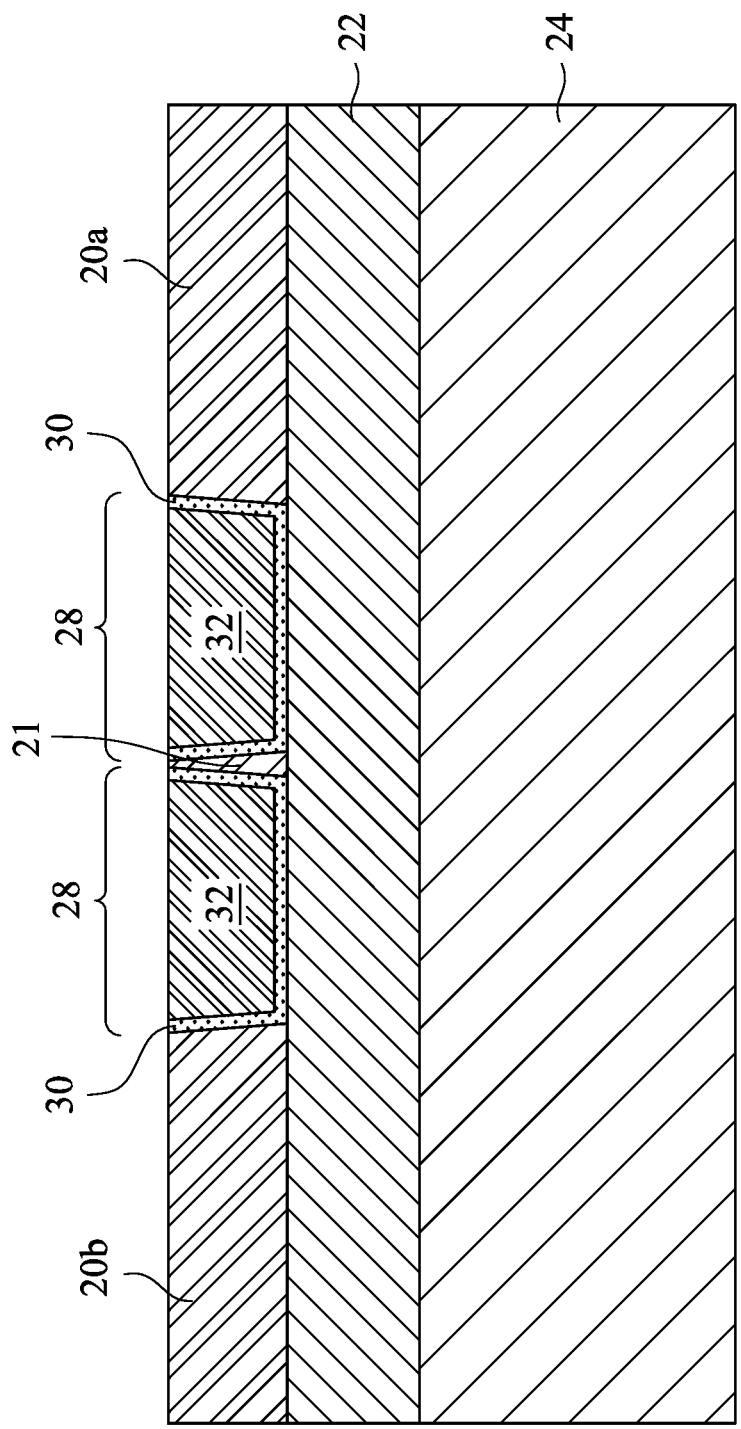

Reference is made to FIGS. 4A and 4B. FIG. 4A illustrates a top view of the formation of STI regions 28, which are in semiconductor layer 20. FIG. 4B illustrates a cross-sectional view of the structure shown in FIG. 4A, taken along a plane crossing line A-A' in FIG. 4A. After the formation of the trenches 20t, trench liners 30 are conformingly formed in the trenches 20t. Trench liners 30 may include silicon oxide, although other dielectric materials may also be used. Next, dielectric material 32 is filled into the remaining portion of the trenches 20t. In some embodiments, dielectric material 32 includes un-doped oxide material. The filling of dielectric material 32 may be performed using high-density plasma chemical vapor deposition (HDP-CVD). However, other suitable methods, such as sub-atmospheric CVD (SACVD), high aspect ratio process (HARP) and spin-on can also be used. A chemical mechanical polish (CMP) is then performed to remove excess dielectric material 32 over hard mask 36. Next, hard mask 36 is removed, leaving STI regions 28 in the semiconductor layer 20.

In some embodiments, the STI regions 28 include two slots. As shown in FIG. 4A, the elongated STI regions 28 divide the semiconductor layer 20 into different regions. The semiconductor layer 20 in between the STI regions 28 are referred to as dummy active region 21, and the remaining region of the semiconductor layer 20 are referred to as first active region 20a and second active region 20b. The first and second active regions 20a and 20b are spaced apart by the STI regions 28 (including the dummy active region 21).

Figure 5A:
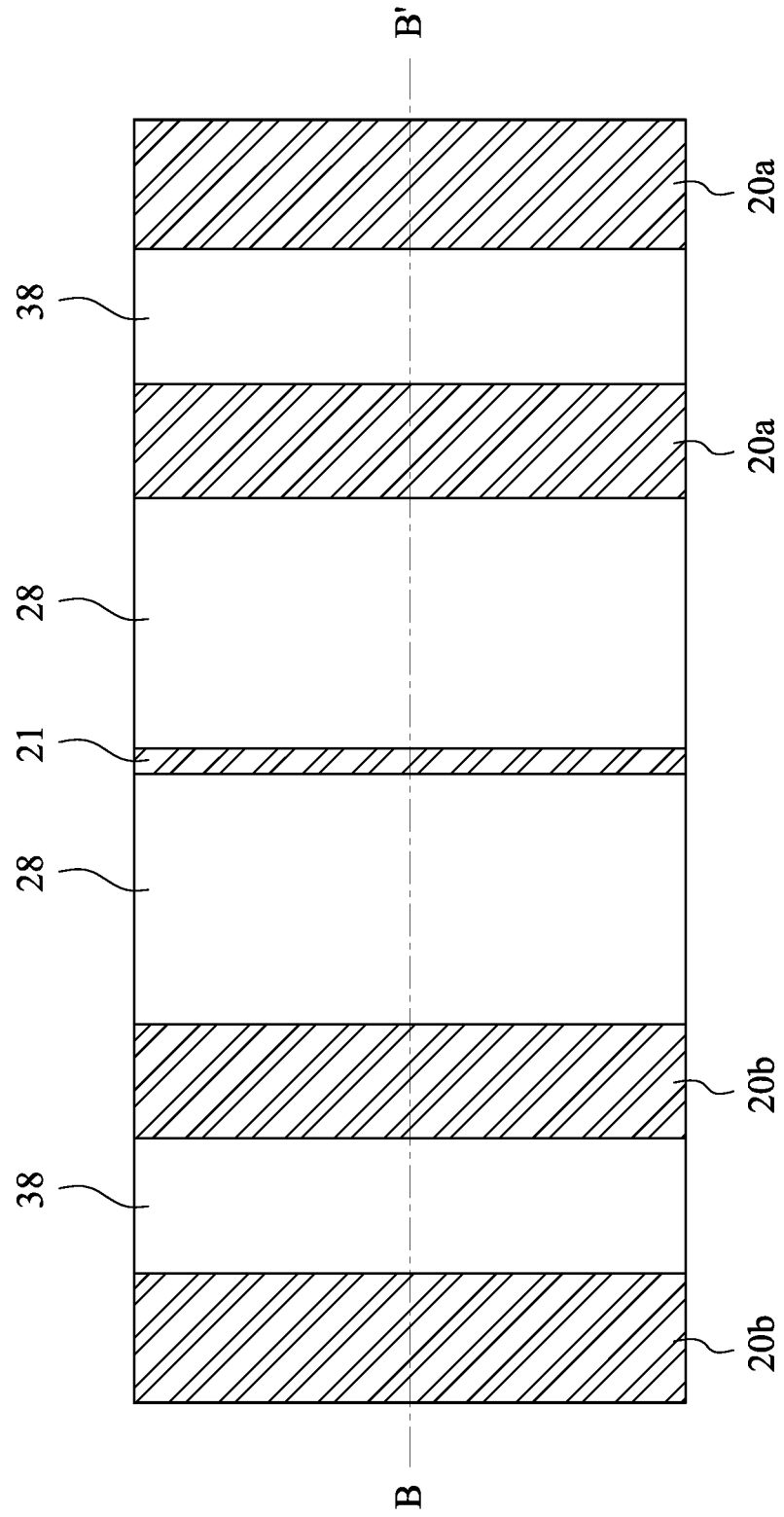
Figure 5B:
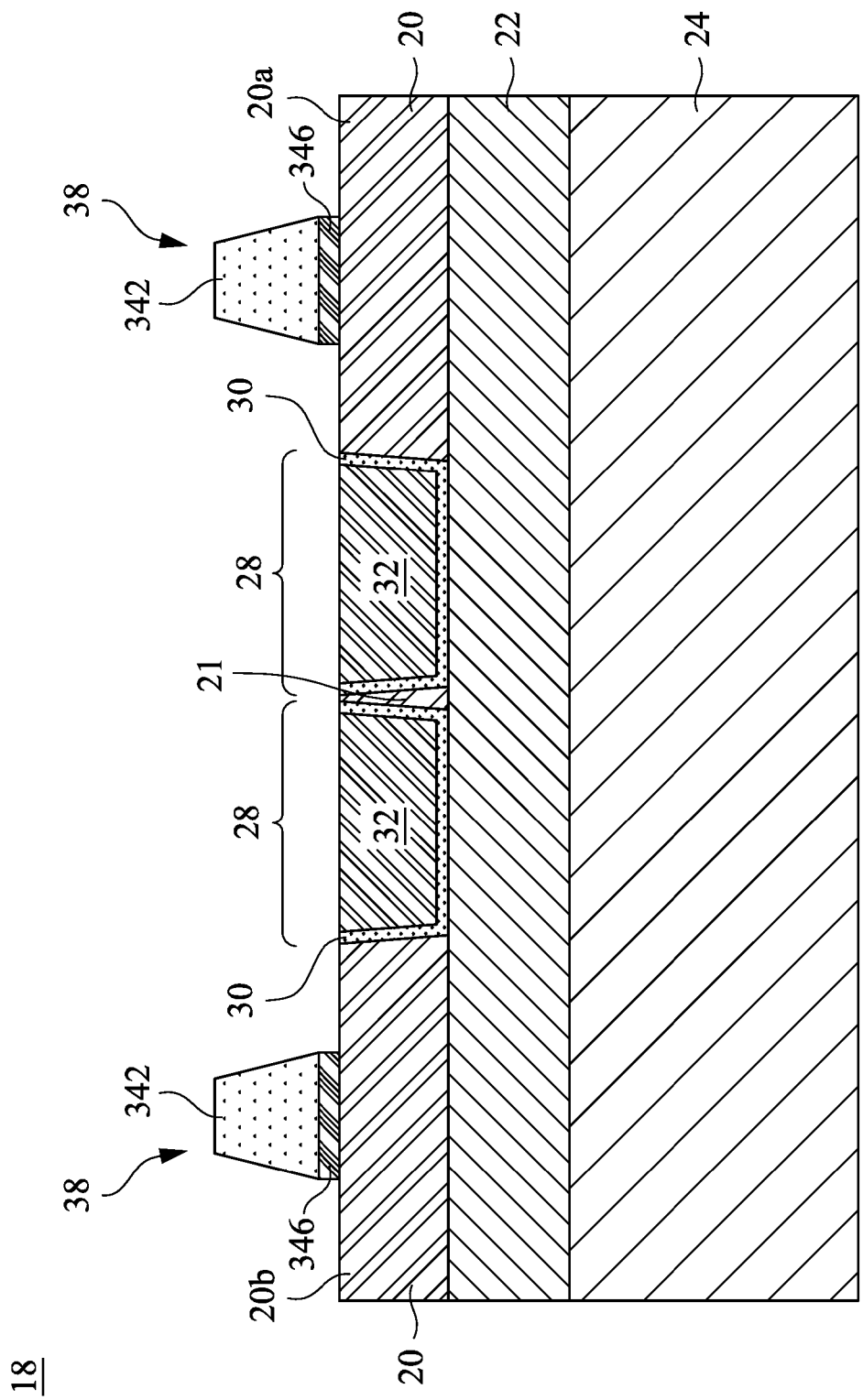

Reference is made to FIGS. 5A and 5B. FIG. 5A illustrates a top view of the formation of gate structures 38 on the semiconductor layer 20. FIG. 5B illustrates a cross-sectional view of the structure shown in FIG. 5A, taken along a plane crossing line B-B' in FIG. 5A. As shown in FIGS. 5A and 5B, gate structures 38 include gate electrodes 342 and underlying gate dielectric layers 346. In some embodiments, the gate electrodes 342 are polysilicon gate electrodes. Examples of a material of the gate dielectric layers 346 include $SiO_2$, $Si_3N_4$, $Si_3O_4$, $Si_3ON$, a high-k dielectric material, combinations thereof, or the like. The gate structures 38 form portions of the resulting MOS devices on the first active region 20a and second active region 20b respectively on the semiconductor layer 20. The dummy active region 21 is not used to form MOS devices and free of gate structures. In some embodiments as shown in FIG. 5B, gate structures 38 are p-type MOS devices. In alternative embodiments, gate structures 38 are n-type MOS devices. In yet other embodiments, gate structures 38 include one p-type MOS device and one n-type MOS device. In some embodiments, two or more active components are formed over the first active region 20a and the second active region 20b, respectively. Gate structures 38 and STI regions 28 may have their lengthwise directions substantially parallel to each other. Gate structures 38 are spaced apart from each other by the STI regions 28 and dummy active region 21. The STI regions 28 closely flank the dummy active region 21 in between, and an area of the dummy active region 21 is smaller than the regular first active regions 20a and the second active regions 20b. The edges of the STI regions 28 nearly touch each other, such that a slit of the dummy active region 21 is exposed between the STI regions 28.

Figure 6:
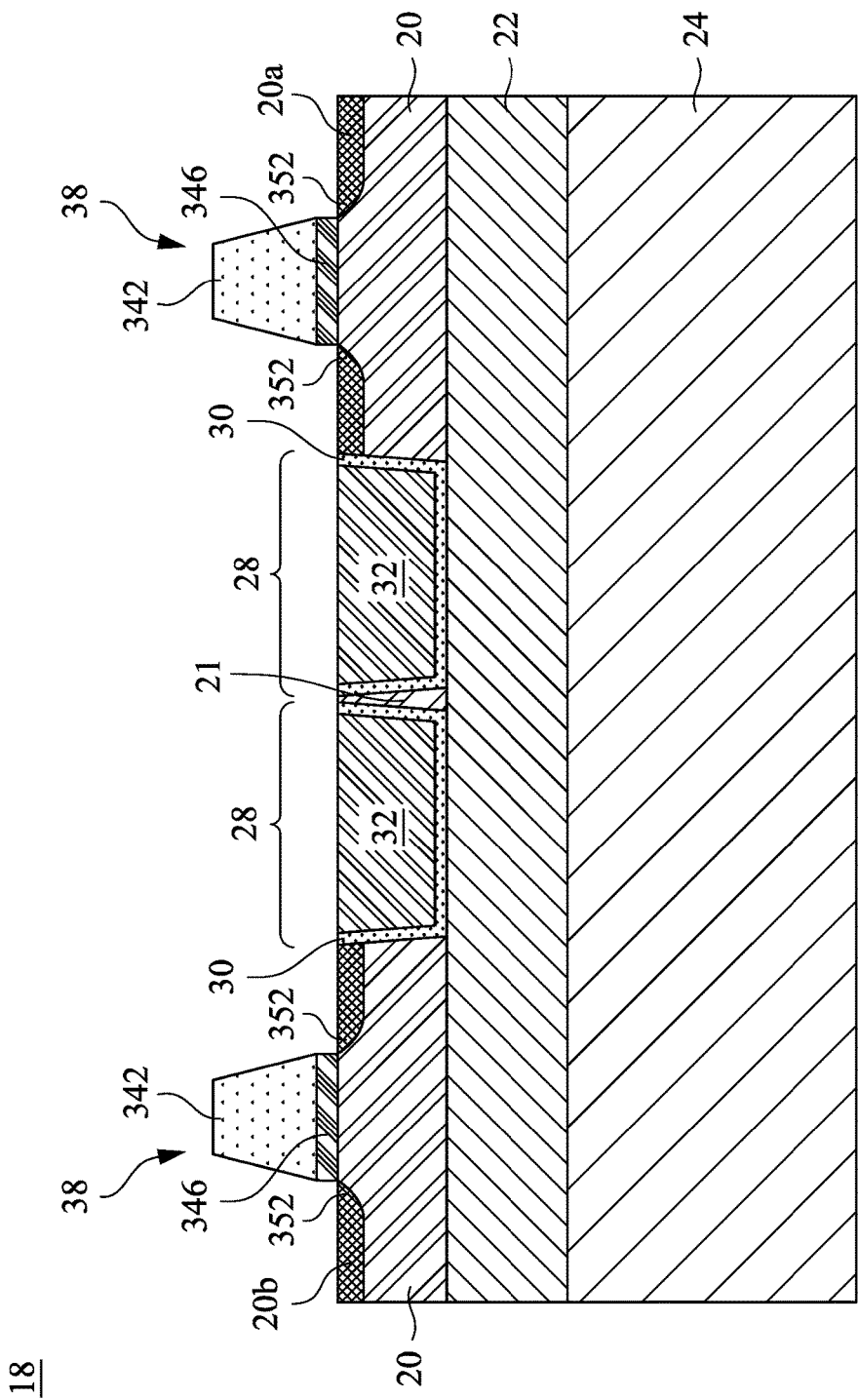

Reference is made to FIG. 6. An ion implantation process is performed to form lightly doped drain (LDD) regions 352. The gate structures 38 are used as masks to help control the implant profile and distribution. FIG. 6 shows the LDD regions 352 formed in the semiconductor layer 20.

Figure 7:
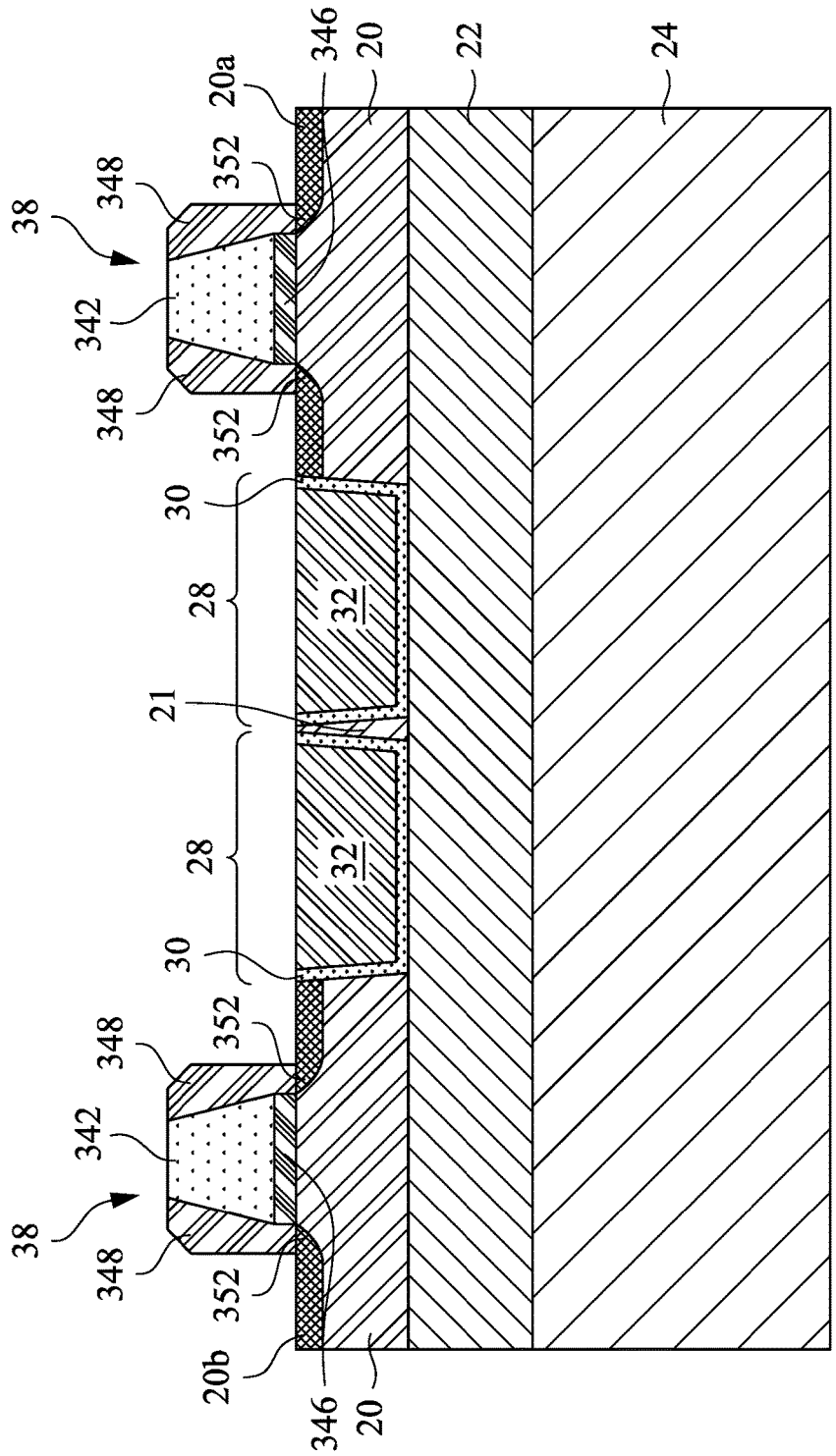

Reference is made to FIG. 7. After the ion implantation process, spacers 348 are formed around the gate structures 38. A spacer material is first deposited over the semiconductor layer 20 covering the gate structures 38, STI regions 28, dummy active region 21 and the areas therebetween. The spacer material is then etched back to remove the portions over the gate structures 38 and in the areas between the gate structures 38. By tuning the parameters of the etching process, selected portions of the spacer material around the gate structures 38 remain after the etching back. The spacers 348 may be made of silicon nitride or another material that has the properties of conformal deposition. In some embodiments, before forming the spacers 348, optional spacer liners (not shown) may be formed.

Figure 8:
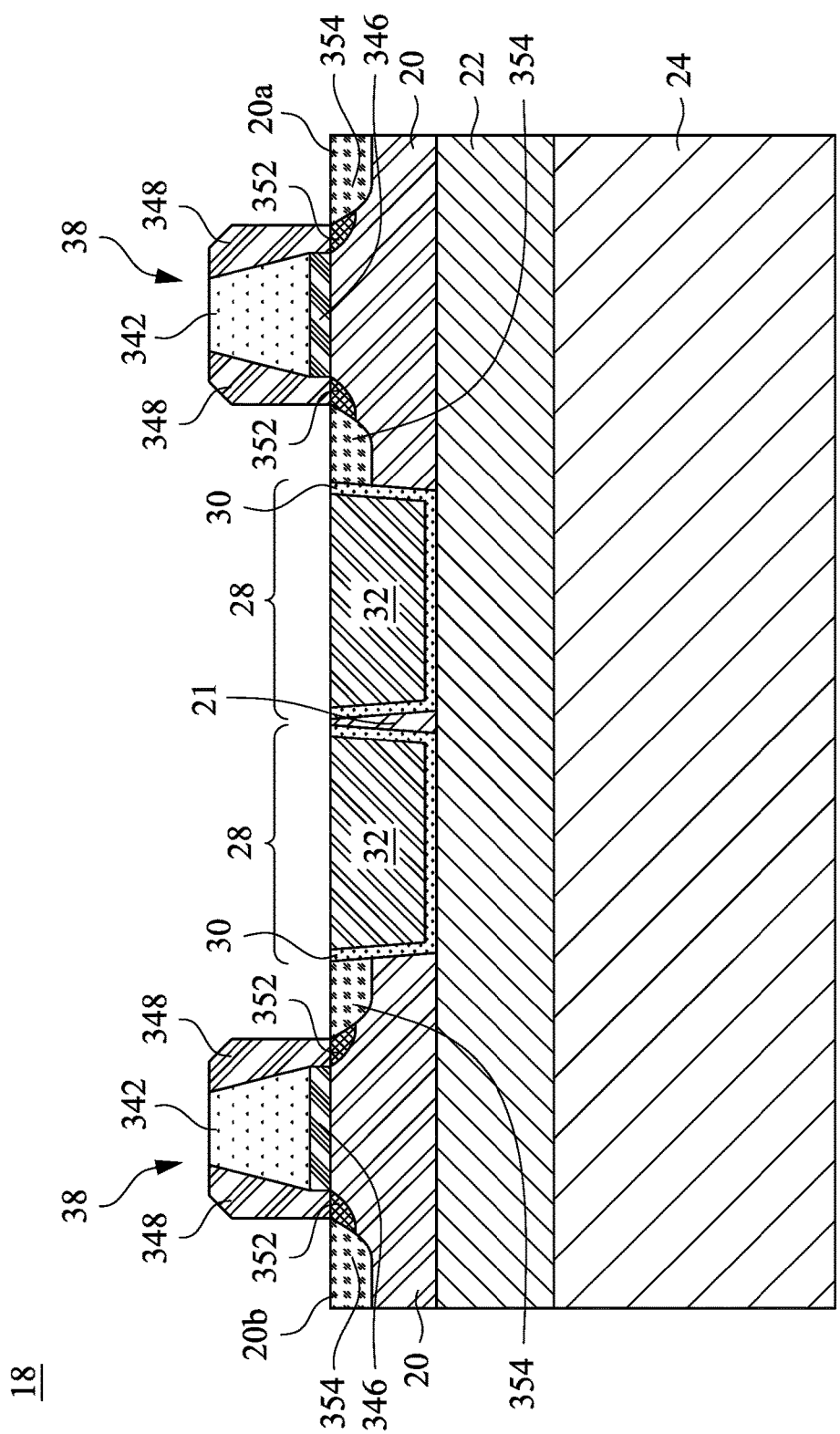

Reference is made to FIG. 8. Source/drain regions 354 are formed after the spacers 348 are formed. The source/drain regions 354 are formed in the first active region 20a and second active region 20b in the semiconductor layer 20 by implanting appropriate p-type or n-type impurities. The first active region 20a and second active region 20b may be formed of silicon germanium (SiGe), silicon carbon (SiC) or the like, depending on the type of MOS devices, respectively. In the embodiments where the gate structures 38 are used to form a p-channel MOS device, the source/drain regions 354 are of p-type. In the embodiments where the gate structures 38 are used to form an n-channel MOS device, the source/drain regions 354 are of n-type.

Figure 9:
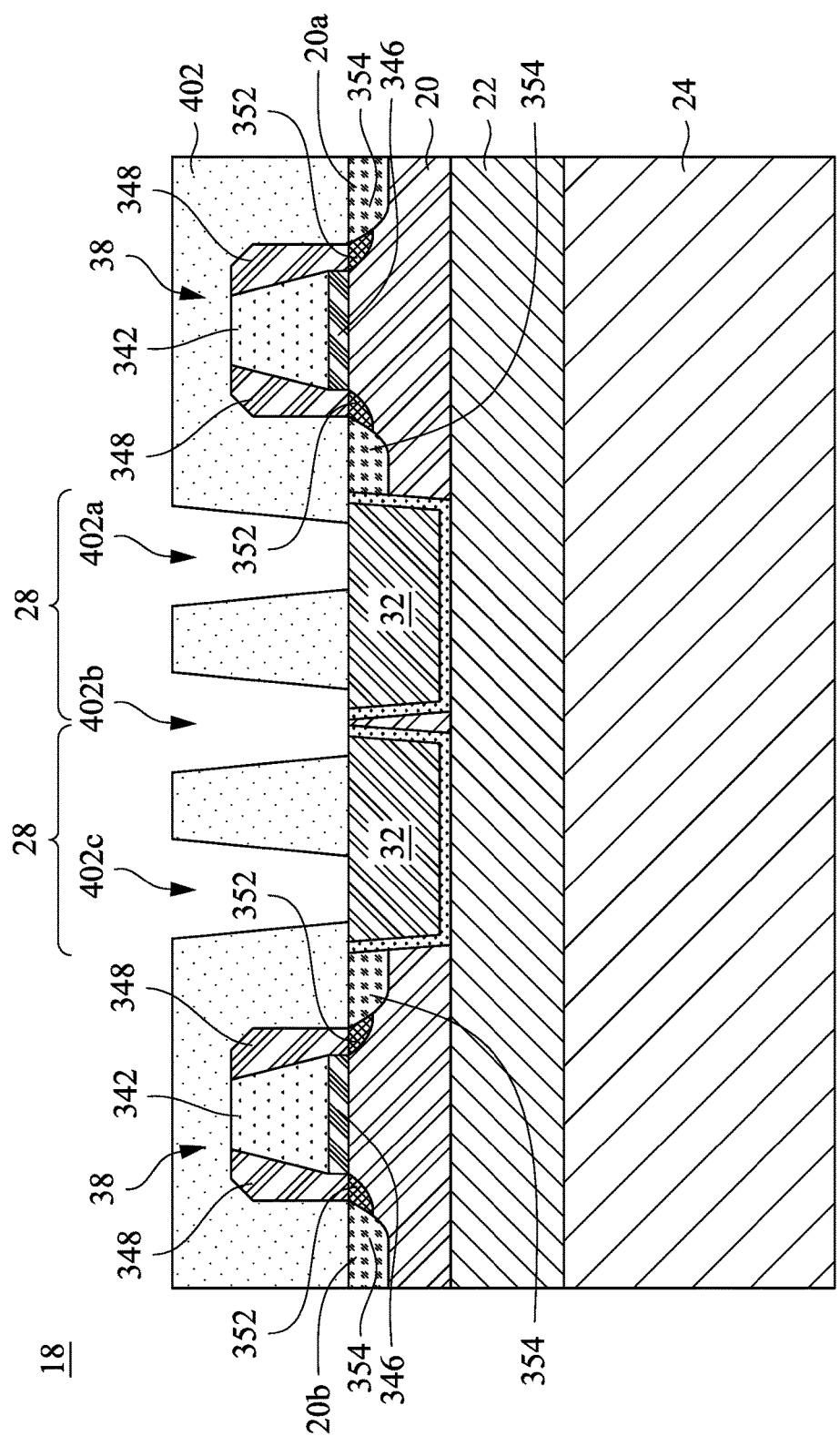

Reference is made to FIG. 9. A photoresist layer 402 is deposited on the semiconductor layer 20 and patterned. A photomask (not shown) may be disposed on the photoresist layer 402. The photomask and photoresist layer 402 are then exposed to radiation such as ultraviolet light. A bake or cure operation may be performed to harden the photoresist layer 402. A developer is then used to remove the exposed/unexposed portions of the photoresist depending on whether a positive or a negative resist is used. Subsequently, a pattern such as the pattern shown in FIG. 9 is formed. The openings 402a and 402c are located on the STI regions 28, close to the first active region 20a and second active region 20b respectively and have lengthwise directions substantially parallel to the STI regions 28. The opening 402b is located between the openings 402a and 402c and exposes the dummy active region 21 and portions of the STI regions 28. The width of the opening 402b is broader than the width of the dummy active region 21. In some embodiments, as shown in FIG. 9, the openings 402a, 402b and 402c are spaced apart with equal distance. In alternative embodiments, the openings 402a, 402b and 402c may be spaced apart by different distances. The dimension of the openings 402a, 402b and 402c may vary from each other. For example, the opening 402b may have a larger width than the opening 402a. The openings 402a, 402b and 402c remain within the boundary of the STI regions 28 and do not overlap with (expose) the first active region 20a and second active region 20b (source/drain regions 354). The openings 402a, 402b and 402c are not too broad because they define the deep trench isolation region that will be formed in a later stage. The high-aspect ratio deep trench has pivotal effect in the formation of air voids in the deep trench. In some embodiments, the number of the opening may be more than three, and the number of deep trenches changes accordingly.

Figure 10B:
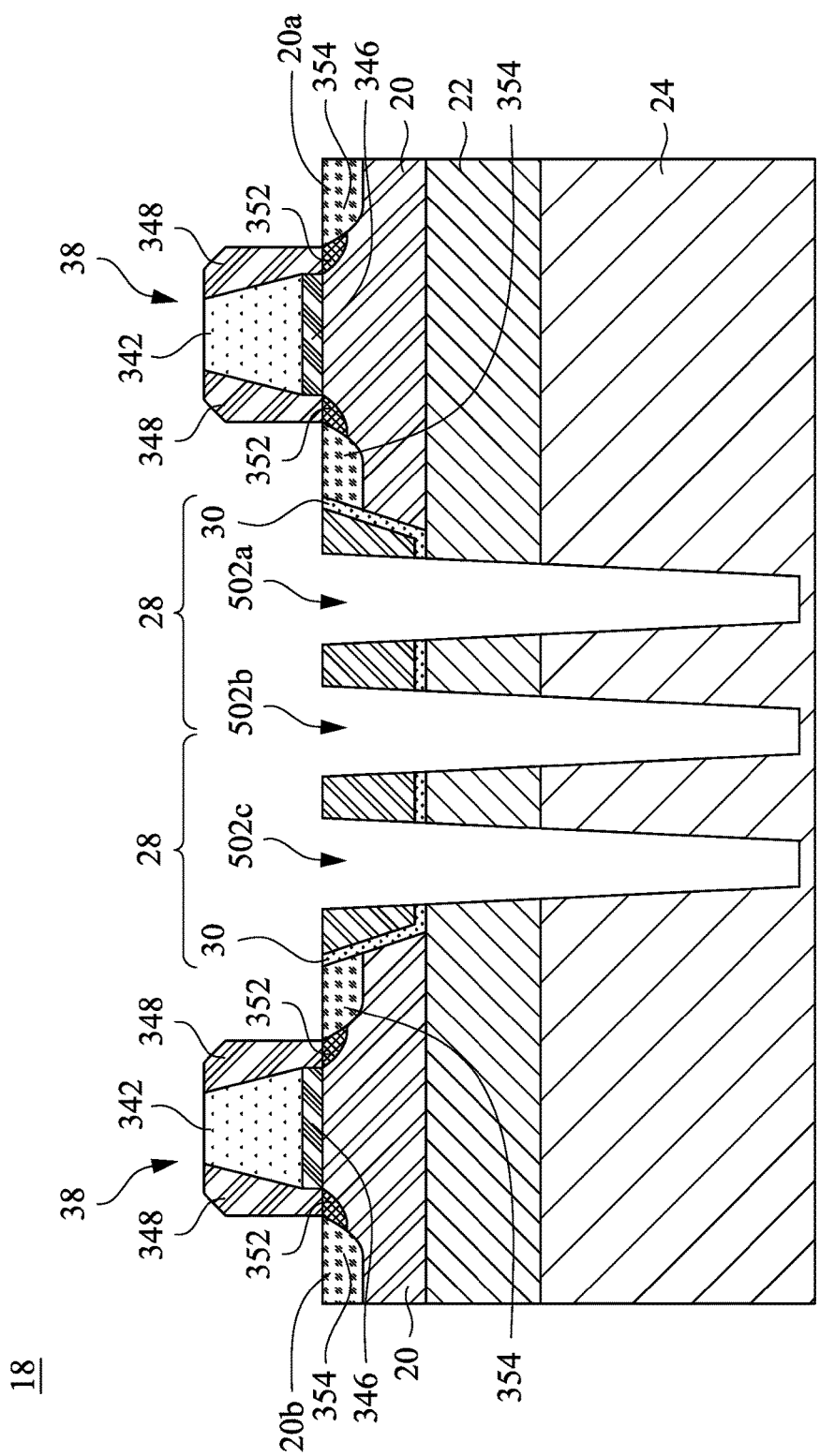

Reference is made to FIGS. 10A and 10B. FIG. 10A illustrates a top view of the formation of deep trenches 502a, 502b and 502c in the semiconductor substrate 18. FIG. 10B illustrates a cross-sectional view of the structure shown in FIG. 10A, taken along a plane crossing line C-C' in FIG. 10A. An etching process is performed to remove portions of STI regions 28, buried insulator layer 22 and handle substrate 24. In some embodiments, the dummy active region 21 that is between the STI regions 28 is completely removed after the etching. In some embodiments, the dummy active region 21 is partially removed after the etching process. The etching process may involve different etchants because the target materials include dummy active region 21 (semiconductor layer 20), STI regions 28 (trench liner 30), buried insulator layer 22 and handle substrate 24. This broad variety of materials that are to be removed in the etching process may result in selection of different etching agents during the etching process. The etching process may be performed repeatedly with different targets in each cycle.

The pattern in the photoresist layer 402 is transferred in to the underlying layers. The openings 402a, 402b, 402c expose the STI regions 28 and dummy active region 21. The STI regions 28 and dummy active region 21 are firstly removed in the etching process. The etching continues to extend the openings 402a, 402b and 402c downwardly, so that the underlying buried insulator layer 22 and a portion of handle substrate 24 are also removed, forming deep trenches 502a, 502b and 502c in the semiconductor substrate 18. The deep trenches 502a, 502b and 502c have a bottom landing at the handle substrate 24 as shown in FIG. 10B. The STI regions 28 which include two slots are then split into separate portions as shown in FIG. 10B. As shown in FIG. 10A, the STI regions 28 are now in four strips, running on either side of the three deep trenches 502a, 502b and 502c. Deep trench dividing pillars are formed, and from top to bottom the pillars include STI region 28, trench liner 30, buried insulator 22 and semiconductor layer 24. These pillars (including the handle substrate 24, buried insulator layer 22 and STI regions 28) separate deep trenches 502a, 502b and 502c from each other. These deep trench dividing pillars resemble a shape of comb, in which the deep trenches 502a, 502b and 502c are the valley portions and the pillars are the spikes.

Deep trenches 502a, 502b and 502c extend from the STI regions 28 toward the handle substrate 24 and have high aspect ratio that is greater than the STI regions 28. Deep trenches 502a, 502b and 502c have the width of the openings 402a, 402b and 402c respectively and the height thereof is measured from the top surface of the STI regions 28 to a level in the handle substrate 24. The width of the deep trenches 502a, 502b and 502c is smaller than the height thereof so as to create the narrow slots downward from the STI regions 28. In some embodiments, the STI regions 28 may have a thickness of approximately 700-900 angstroms (Å), the buried insulator layer 22 has a thickness of approximately 1800-2200 Å, and the handle substrate 24 has a thickness of approximately 3000-3400 Å. The width of the deep trenches 502a, 502b and 502c is smaller than about 1150 Å and an aspect ratio (height to width) thereof is equal to or greater than about 4.5. A smaller aspect ratio increases the difficulty of forming air voids in the subsequent process. If the aspect ratio (height to width) of the deep trenches 502a, 502b and 502c is smaller than about 4.5, air voids may not be formed in the subsequent process. Deep trenches 502a, 502b and 502c are formed within the existing STI regions 28 by etching further down the semiconductor substrate 18 without expanding the isolation structure laterally.

The terms "about" as used herein may be applied to modify any quantitative representation which could permissibly vary without resulting in a change in the basic function to which it is related. For example, the aspect ratio of the deep trenches 502a, 502b and 502c as disclosed herein being equal to or greater than about 4.5 may permissibly be somewhat smaller than 4.5 within the scope of the invention if air voids can be formed in the deep trenches 502a, 502b and 502c in the subsequent process.

Figure 11:
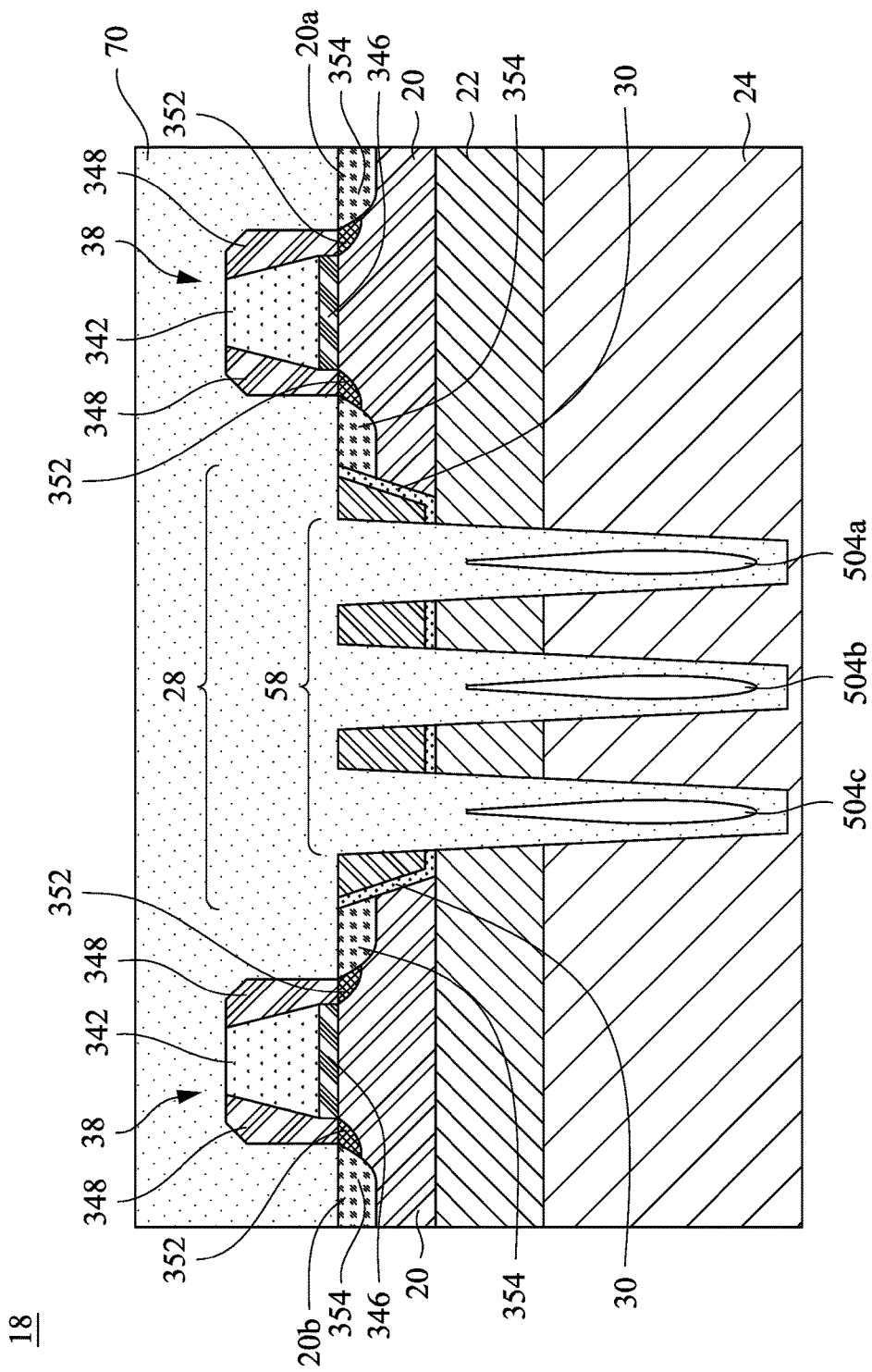

Reference is made to FIG. 11, illustrating the formation of the interlayer dielectric (ILD) layer 70 and deep trench isolation structures 58. The ILD layer 70 may include silicon oxide formed using, for example, chemical vapor deposition (CVD) or the like. Alternatively, ILD layer 70 may include doped oxide materials, such as boronphosphosilicate glass (BPSG), phosphosilicate glass (PSG), or the like. In some embodiments, a contact etch stop layer (not shown) may be blanket formed on the semiconductor substrate 18 before the deposition of the ILD layer 70. In some embodiments, the ILD layer 70 and the STI regions 28 may have the same material. In alternative embodiments, the ILD layer 70 and the STI regions 28 may have different materials. During ILD blanket deposition, the top surface of the semiconductor substrate 18 (i.e., above the semiconductor substrate 18) has a first ILD deposition rate, and deep down within the deep trenches 502a, 502b and 502c has a second ILD deposition rate. The first ILD deposition rate and the second ILD deposition rate are substantially the same. On the top surface of the semiconductor substrate 18, which is relatively open and broad, the ILD deposition rate does not cause irregular deposition. On the other hand, because the deep trenches 502a, 502b and 502c have an aspect ratio equal to or higher than 4.5, which is narrower than the top surface of the semiconductor substrate 18, when the identical ILD deposition rate occurs within the deep trenches 502a, 502b and 502c, air voids are formed therein. The ILD deposition rate may be adjusted by tuning the power of the CVD process to achieve a faster or slower speed. The ILD layer 70 extends into the deep trenches 502a, 502b and 502c by stacking layers of the ILD material during the process, and the identical ILD deposition rate results in formation of air voids 504a, 504b and 504c therein respectively.

Reference is still made to FIG. 11. The air voids 504a, 504b and 504c are formed near the bottom of the deep trenches 502a, 502b and 502c and lower than the top surface of the STI regions 28. In some embodiments, the air voids 504a, 504b and 504c are located under the interface between the semiconductor layer 20 and the buried insulator layer 22. One end of the air voids 504a, 504b and 504c starts from the buried insulator layer 22 and extends in the depth direction to the level of handle substrate 24. In alternative embodiments, the tips of the air voids 504a, 504b and 504c may be higher than the interface between the semiconductor layer 20 and the buried insulator layer 22. A bottom of the air voids 504a, 504b and 504c is lower than the interface between the buried insulator layer 22 and handle substrate 24. The air voids 504a, 504b and 504c are elongated slit in the deep trenches 502a, 502b and 502c. In some embodiments, each of the deep trenches 502a, 502b and 502c may have more than one air void.

Reference is still made to FIG. 11. The STI regions 28 are now intertwined with the deep trench isolation structures 58 in which the top portion of the deep trench isolation structures 58 and the STI regions 28 are in alternating fashion. The four strips of the STI regions 28 interpose between the three deep trench isolation structures 58. Alternatively speaking, the deep trench isolation structures 58 and the STI regions 28 are overlapped with respect to a top view. The top portion of the deep trench isolation structures 58 also account for the STI regions 28. The isolation region is now a combination of STI regions 28 and deep trench isolation structures 58. The deep trench isolation structures 58 resemble a shape of comb, in which the deep trench isolation structures 58 are the spikes. The deep trench isolation structures 58 may be seen as extension of the STI regions 28 toward the handle substrate 24 so as to create a more robust isolation structure in the semiconductor substrate 18. The deep trench isolation structures 58 have air voids 504a, 504b and 504c therein, and these air voids help to reduce crosstalk between active components. The coupling current crossing the semiconductor substrate 18 is now blocked by a sea of air voids 504a, 504b and 504c. The addition of the deep trench isolation structures 58 does not increase distance between gate structures 38 (active components). The isolation structure, which includes the STI regions 28 and deep trench isolation structures 58, in the semiconductor substrate 18 occupies the same width but has higher density and a more effective noise blocking system because the air voids 504a, 504b and 504c have a dielectric constant approximately to 1. In some embodiments, the ILD layer 70 has an oxide material having a dielectric constant approximately 4. The air voids 504a, 504b and 504c are capable of reducing crosstalk between devices to a greater extent in comparison with dielectric material alone because of a lower dielectric constant. Effective crosstalk isolation of circuits can be accomplished by inserting a barrier of air voids adjoining noise sensitive circuits.

Figure 12:
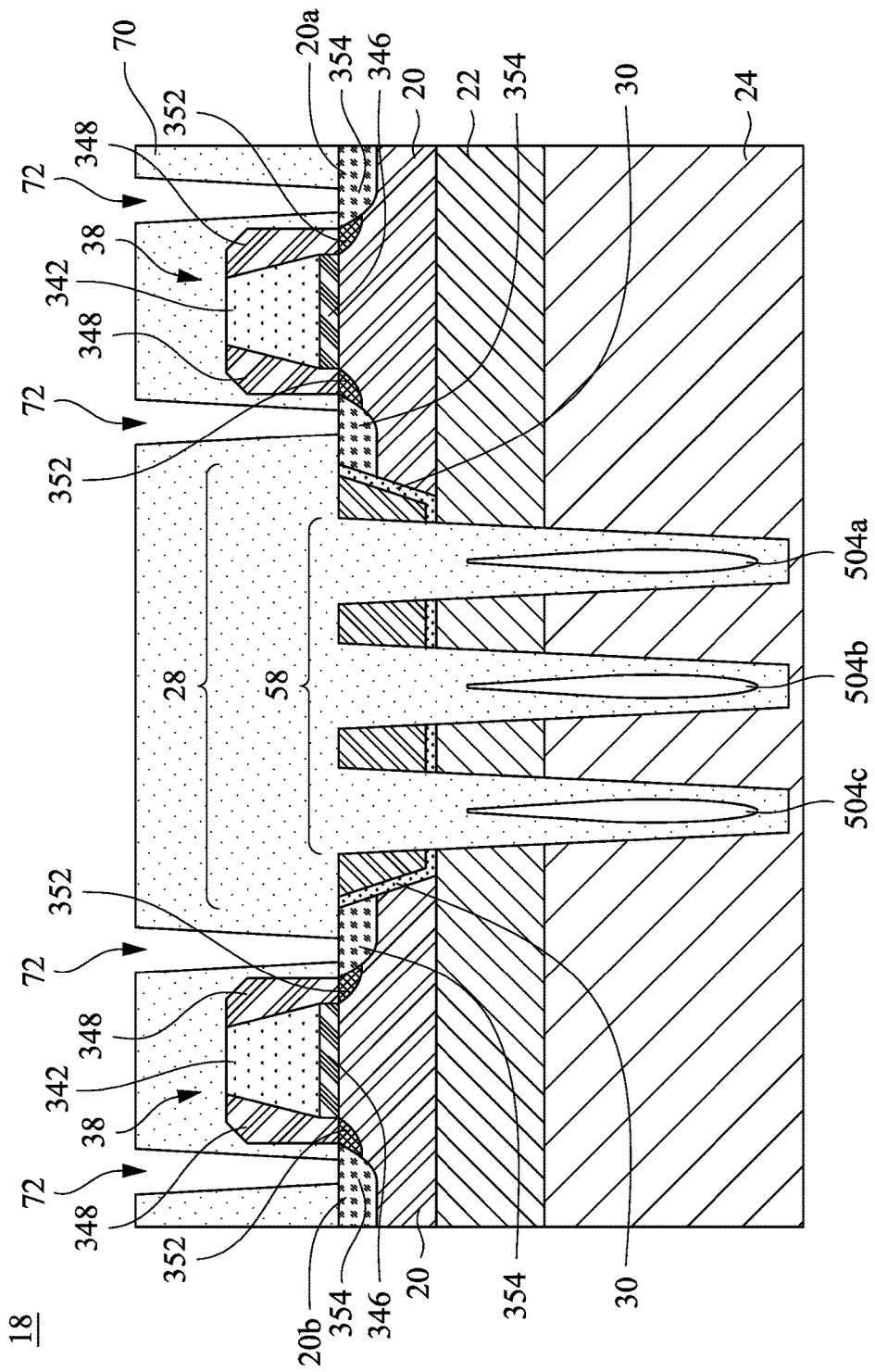

Reference is made to FIG. 12. Source/drain contact openings 72 are formed in ILD layer 70 to expose source/drain regions 354 in the first active region 20a and second active region 20b. An photoresist layer (not shown) can be formed by depositing a blanket dielectric material layer, lithographically patterning the photoresist by lithographic exposure and development, and removing portions of the blanket dielectric material layer underneath openings in the photoresist employing an etch. The etch can be a dry etch such as anisotropic ion etch, or a wet etch. The remaining portions of the blanket dielectric material layer constitute the etch mask layer. At least one source/drain region 354 is exposed upon the formation of the source/drain contact opening 72 in the ILD layer 70.

The ILD layer 70 is not only an insulator between different levels but the lower portion of the ILD layer 70 also serves as the deep trench isolation structures 58. The lower portion of ILD layer 70 is a crosstalk reduction isolation structure between lateral active components. The noise enters the active component and results in coupling current in the semiconductor substrate 18. The lower portion of the ILD layer 70, which includes the deep trench isolation structures 58 and air voids 504a, 504b and 504c reduces crosstalk between active components. The upper portion, which is above the top surface of the STI regions 28, of the ILD layer 70 allows source/drain contact plug formation therein and creates vertical communication thereby.

Figure 13:
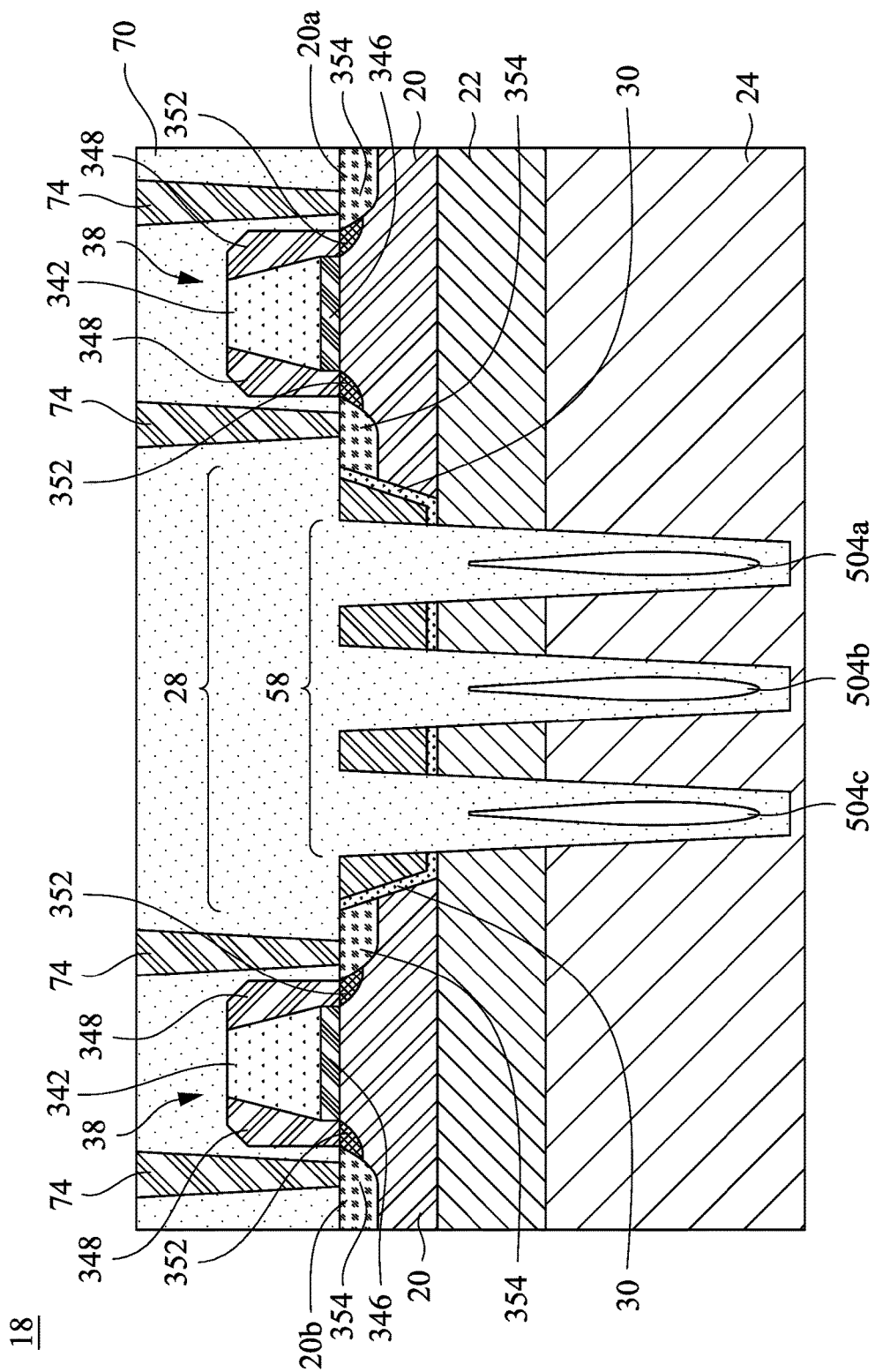

Reference is made to FIG. 13 Source/drain contact plugs 74 are then formed in the source/drain contact openings 72. Examples of the material of source/drain contact plugs 72 include tungsten (W), copper (Cu), and aluminium (Ai) or the like. A filling process of the conductive material can be achieved by using a general plating process, a selective plating process, a general deposition process, a selective deposition process or the like. The source/drain contact openings 72 are filled or overfilled with the conductive material. Subsequently, a planarization process, for example, a chemical mechanical polishing, is then performed to bring the top surface of the ILD layer 70 even. In some embodiments, one of the gate structures 38 is coupled to an antenna for receiving signals, and this terminal is seen as a noise input end. The other gate structure 38 is the output end with low-noise amplifier (LNA)/power amplifier (PA). The deep trench isolation structures 58 that have air voids help to reduce the coupling current between the input end and the output end (gate structures 38) because the air has a dielectric constant close to 1. Therefore unwanted crosstalk between active components is reduced.

The deep trench isolation structure extends from the STI regions downwardly and has air void in the deep trench. The deep trench isolation structure shares the same oxide layer as the ILD layer, while the air void in the deep trench provides an even lower dielectric constant close to about 1. Coupling current between the active components can be effectively blocked by the air void in the deep trench isolation structure without increasing the distance between active components.

In some embodiments, an integrated circuit includes a semiconductor substrate, an isolation region, a first active component and at least one deep trench isolation structure. The isolation region is in the semiconductor substrate. The first active component is on the semiconductor substrate. The deep trench isolation structure extends from a bottom of the isolation region toward a bottom of the semiconductor substrate. The deep trench isolation structure has at least one air void therein.

In some embodiments, the semiconductor substrate is a semiconductor on insulator (SOI) substrate comprising a handle substrate, a semiconductor layer over the handle substrate, and a buried insulator layer between the handle substrate and the semiconductor layer, and first active component is on in the semiconductor layer.

In some embodiments, a top of the air void is lower than an interface between the semiconductor layer and the buried insulator layer.

In some embodiments, a bottom of the air void is lower than an interface between the buried insulator layer and the handle substrate.

In some embodiments, the deep trench isolation structure and the buried insulator layer comprises a same material.

In some embodiments, the integrated circuit further includes an interlayer dielectric (ILD) layer over the first active component. The ILD layer and the deep trench isolation structure comprises a same material.

In some embodiments, the integrated circuit further includes a second active component. The isolation region is between the first active component and the second active component.

In some embodiments, an integrated circuit includes a semiconductor substrate, an isolation region and a plurality of deep trench isolation structures. The isolation region is in the semiconductor substrate. Deep trench isolation structures extend from a bottom of the isolation region toward a bottom of the semiconductor substrate. The deep trench isolation structure has at least one air void therein.

In some embodiments, the semiconductor substrate is a semiconductor on insulator (SOI) substrate comprising a handle substrate, a semiconductor layer over the handle substrate, and a buried insulator layer between the handle substrate and the semiconductor layer.

In some embodiments, the handle substrate separates the deep trench isolation structures from each other.

In some embodiments, each of the deep trench isolation structures has at least one air void therein.

In some embodiments, the deep trench isolation structures resemble a shape of comb.

In some embodiments, the integrated circuit further include a gate strip over the first active region, wherein at least one of the deep trench isolation structures and the gate strip have lengthwise directions parallel to each other.

In some embodiments, a method of manufacturing a semiconductor device includes forming an isolation region between a plurality of active regions of a semiconductor substrate. At least one deep trench is formed and extending from the isolation region toward a bottom of the semiconductor substrate. An interlayer dielectric layer is formed on the semiconductor substrate. The interlayer dielectric layer fills in the deep trench to form a deep trench isolation structure and an air void in the deep trench isolation structure.

In some embodiments, the forming the isolation region between the active regions includes forming a first isolation region and a second isolation region, wherein the first isolation region and the second isolation region is spaced apart by a dummy active region.

In some embodiments, the forming the deep trench includes etching at least the dummy active region and the semiconductor substrate to form the deep trench.

In some embodiments, the semiconductor substrate comprises a handle substrate, a semiconductor layer over the handle substrate, a buried insulator layer between the handle substrate and the semiconductor layer, wherein the active regions are in the semiconductor layer. The forming the deep trench includes etching at least the isolation region, the buried insulator layer, and the handle substrate to form the deep trench.

In some embodiments, the deep trench has an aspect ratio larger than 4.5.

In some embodiments, a first deposition rate of the interlayer dielectric layer in the deep trench and a second deposition rate of the interlayer dielectric layer over the semiconductor substrate are substantially the same.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a semiconductor substrate, wherein the semiconductor substrate is a semiconductor on insulator (SOI) substrate comprising a handle substrate, a semiconductor layer over the handle substrate, and a buried insulator layer between the handle substrate and the semiconductor layer;
    an isolation region in the semiconductor substrate;
    a first active component on the semiconductor layer of the semiconductor substrate; and
    at least one deep trench isolation structure extending from a bottom of the isolation region toward a bottom of the semiconductor substrate, the deep trench isolation structure having at least one air void therein.

2. The integrated circuit of claim 1, wherein a top of the air void is lower than an interface between the semiconductor layer and the buried insulator layer.

3. The integrated circuit of claim 1, wherein a bottom of the air void is lower than an interface between the buried insulator layer and the handle substrate.

4. The integrated circuit of claim 1, wherein the deep trench isolation structure and the buried insulator layer comprise a same material.

5. The integrated circuit of claim 1, further comprising:
    an interlayer dielectric (ILD) layer over the first active component, wherein the ILD layer and the deep trench isolation structure comprise a same material.

6. The integrated circuit of claim 1, further comprising:
    a second active component, wherein the isolation region is between the first active component and the second active component.

7. An integrated circuit comprising:
    a semiconductor substrate, wherein the semiconductor substrate is a semiconductor on insulator (SOI) substrate comprising a handle substrate, a semiconductor layer over the handle substrate, and a buried insulator layer between the handle substrate and the semiconductor layer;
    an isolation region in the semiconductor substrate; and a plurality of deep trench isolation structures extending from a bottom of the isolation region toward a bottom of the semiconductor substrate.

8. The integrated circuit of claim 7, wherein a portion of the handle substrate separates the deep trench isolation structures from each other.

9. The integrated circuit of claim 7, wherein each of the deep trench isolation structures has at least one air void therein.

10. The integrated circuit of claim 7, wherein the deep trench isolation structures resemble a shape of comb.

11. The integrated circuit of claim 7, further comprising:
a gate strip over the semiconductor substrate, wherein at least one of the deep trench isolation structures and the gate strip have lengthwise directions substantially parallel to each other.

12. An integrated circuit comprising:
a semiconductor substrate;
an isolation region in the semiconductor substrate;
at least one pillar extending from a bottom of the isolation region toward a bottom of the semiconductor substrate, the pillar tapering in a first direction away from the bottom of the semiconductor substrate; and
a plurality of deep trench isolation structures respectively on opposite sidewalls of the pillar.

13. The integrated circuit of claim 12, wherein the pillar has a same material as the semiconductor substrate.

14. The integrated circuit of claim 12, wherein the pillar comprises a semiconductor layer and an insulator layer over the semiconductor layer.

15. The integrated circuit of claim 12, wherein a number of the at least one pillar is plural, and the pillars and the deep trench isolation structures are arranged in an alternating manner.

16. The integrated circuit of claim 12, wherein the deep trench isolation structures taper in a second direction opposite the first direction.

17. The integrated circuit of claim 12, wherein the deep trench isolation structures comprise air voids therein, and tops of the air voids are lower than a top of the pillar.

18. The integrated circuit of claim 1, wherein the deep trench isolation structure extends through the buried insulator layer of the SOI substrate.

19. The integrated circuit of claim 7, wherein the deep trench isolation structures extend through the semiconductor layer of the SOI substrate.

20. The integrated circuit of claim 12, wherein the semiconductor substrate is a semiconductor on insulator (SOI) substrate.

* * * * *